United States Patent
Cherala

(10) Patent No.: US 9,993,962 B2
(45) Date of Patent: Jun. 12, 2018

(54) METHOD OF IMPRINTING TO CORRECT FOR A DISTORTION WITHIN AN IMPRINT SYSTEM

(71) Applicant: CANON KABUSHIKI KAISHA, Tokyo (JP)

(72) Inventor: Anshuman Cherala, Austin, TX (US)

(73) Assignee: CANON KABUSHIKI KAISHA, Tokyo (JP)

(*) Notice: Subject to any disclaimer, the term of this patent is extended or adjusted under 35 U.S.C. 154(b) by 0 days. days.

(21) Appl. No.: 15/162,130

(22) Filed: May 23, 2016

(65) Prior Publication Data
US 2017/0334126 A1  Nov. 23, 2017

(51) Int. Cl.
| | | |
|---|---|---|
| B29C 59/02 | (2006.01) | |
| B29C 35/08 | (2006.01) | |
| B29C 59/00 | (2006.01) | |
| B29L 7/00 | (2006.01) | |
| B29L 9/00 | (2006.01) | |
| B81C 1/00 | (2006.01) | |
| G03F 7/00 | (2006.01) | |
| H01L 21/306 | (2006.01) | |
| H01L 21/3065 | (2006.01) | |

(Continued)

(52) U.S. Cl.
CPC ........ B29C 59/026 (2013.01); B29C 35/0805 (2013.01); B29C 59/002 (2013.01); B29C 2035/0827 (2013.01); B29L 2007/001 (2013.01); B29L 2009/005 (2013.01); B81C 1/0046 (2013.01); G03F 7/0002 (2013.01); H01L 21/3065 (2013.01); H01L 21/3086 (2013.01); H01L 21/30604 (2013.01); H01L 21/31133 (2013.01); H01L 21/31138 (2013.01)

(58) Field of Classification Search
CPC ................ B29C 59/026; B29C 59/002; B29C 2035/0827; B29C 35/0805; H01L 21/3086; H01L 21/31138; H01L 21/31133; H01L 21/3065; H01L 21/30604; G03F 7/0002; B81C 1/0046; B29L 2009/005; B29L 2007/001
See application file for complete search history.

(56) References Cited

U.S. PATENT DOCUMENTS

| | | |
|---|---|---|
| 6,873,087 B1 | 3/2005 | Choi et al. |
| 7,170,589 B2 | 1/2007 | Cherala et al. |
| 7,298,456 B2 | 11/2007 | Cherala et al. |

(Continued)

*Primary Examiner* — Anita K Alanko
(74) *Attorney, Agent, or Firm* — Abel Law Group, LLP

(57) ABSTRACT

A method can include placing a substrate over a chucking region, wherein the substrate has a primary surface; quantifying a distortion in the substrate, the lithographic template, the imprint apparatus, or any combination thereof; and dispensing a formable material based at least in part on the distortion. The distortion can include a deviation in planarity, a magnification or orthogonality error or the like. In another aspect, an imprint apparatus can include a substrate holder including a chucking region; a template having an imprint surface that includes protrusions, wherein the protrusions define a primary surface; and a processor configured to determine an amount of a formable material to dispense in a particular area based at least in part on an distortion in the substrate, the lithographic template, the imprint apparatus, or any combination thereof.

18 Claims, 8 Drawing Sheets

(51) Int. Cl.
*H01L 21/308* (2006.01)
*H01L 21/311* (2006.01)

(56) References Cited

U.S. PATENT DOCUMENTS

| | | | |
|---|---|---|---|
| 7,396,475 B2* | 7/2008 | Sreenivasan | B81C 1/0046 |
| | | | 216/11 |
| 7,420,654 B2 | 9/2008 | Cherala et al. | |
| 7,906,058 B2* | 3/2011 | GanapathiSubramanian | |
| | | | B29C 33/444 |
| | | | 156/60 |
| 8,119,052 B2 | 2/2012 | Schumaker | |
| 8,394,282 B2 | 3/2013 | Panga et al. | |
| 8,420,422 B2* | 4/2013 | Asano | B82Y 10/00 |
| | | | 257/E21.525 |
| 8,480,933 B2 | 7/2013 | Truskett et al. | |
| 8,545,709 B2* | 10/2013 | Brooks | B82Y 10/00 |
| | | | 216/41 |
| 8,586,126 B2 | 11/2013 | Schumaker | |
| 8,647,554 B2* | 2/2014 | Jones | B29C 43/003 |
| | | | 264/319 |
| 2006/0068120 A1* | 3/2006 | Sreenivasan | B29C 43/003 |
| | | | 427/532 |
| 2006/0273488 A1* | 12/2006 | Seki | B82Y 10/00 |
| | | | 264/293 |
| 2009/0148619 A1 | 6/2009 | LaBrake et al. | |
| 2009/0212012 A1 | 8/2009 | Brooks et al. | |
| 2010/0012622 A1* | 1/2010 | Panga | B82Y 10/00 |
| | | | 216/52 |
| 2010/0078854 A1* | 4/2010 | Berggren | B82Y 10/00 |
| | | | 264/293 |
| 2010/0098848 A1 | 4/2010 | Truskett et al. | |
| 2010/0215856 A1* | 8/2010 | Kritchman | B29C 67/0059 |
| | | | 427/277 |
| 2011/0134440 A1* | 6/2011 | Hocheng | G01B 11/0625 |
| | | | 356/630 |
| 2012/0061875 A1* | 3/2012 | Kono | B29C 33/022 |
| | | | 264/293 |
| 2012/0072003 A1 | 3/2012 | Matsuoka et al. | |
| 2014/0283698 A1* | 9/2014 | Cok | B29C 33/3857 |
| | | | 101/28 |
| 2014/0367875 A1* | 12/2014 | Shiode | G03F 7/0002 |
| | | | 264/40.1 |
| 2015/0017329 A1 | 1/2015 | Fletcher et al. | |
| 2016/0075076 A1* | 3/2016 | Sato | G03F 7/0002 |
| | | | 264/40.5 |
| 2016/0320696 A1* | 11/2016 | Nishimura | G03F 7/0002 |

* cited by examiner

METHOD OF IMPRINTING TO CORRECT FOR A DISTORTION WITHIN AN IMPRINT SYSTEM

FIELD OF THE DISCLOSURE

The present disclosure relates to imprint apparatuses and methods of using the imprint apparatuses to correct for distortions within imprint systems.

RELATED ART

Imprint apparatuses and techniques can be used to form nanoscale patterns on semiconductor wafers in the fabrication of semiconductor devices. Proper registration or alignment of one pattern layer to a second pattern layer, also referred to as overlay, is important for the final electronic device to function correctly.

A wafer is typically held on the imprint apparatus by a vacuum substrate chuck that has been lapped and polished to a very high flatness so as to limit distortion of the wafer when chucked. However, there are limitations to the flatness achievable by such lapping and polishing technology, such that the wafer can still be distorted when chucked. That is, flatness or planarity deviations in the chuck can cause in-plane distortions in the wafer as the wafer conforms to the chuck. Even if the chuck is ideally flat, planarity deviations can exist in the wafer itself that similarly lead to in-plane distortions once the wafer is chucked. Further distortions can be introduced when an imprint template conforms to a non-flat wafer, likewise causing in-plane distortions in the template. These distortions all affect overlay accuracy. There is a need to address the issues caused by these distortions without causing another issue that would make device fabrication too difficult or complicated.

SUMMARY OF THE INVENTION

In one aspect, an imprint apparatus comprises a substrate holder including a chucking region having a substrate support surface for a substrate; a template holder for an imprint lithographic template having an imprint surface that includes at least one protrusion; and a processor configured to dispense an amount of a formable material in a particular area based at least in part on a distortion in the substrate, the lithographic template, the substrate holder, or any combination thereof.

In an embodiment, the processor is further configured to determine a dispense pattern for the formable material based at least in part on the distortion.

In a particular embodiment, determining the dispense pattern is performed such that the formable material is to be dispensed to a first areal density within a first area, where the distortion indicates that the at least one protrusion and a primary surface of the substrate will be further apart when the imprint lithographic template contacts the formable material within the first area; and a second areal density within a second area, where the distortion indicates that the at least one protrusion and the primary surface of the substrate will be closer to each other when the imprint lithographic template contacts the formable material within the second area, wherein the first areal density is greater than the second areal density.

In another embodiment, the distortion includes a deviation in planarity along a primary surface of the imprint lithographic template, the substrate support surface of the chucking region within the imprint region, a primary surface of the substrate within the imprint region, or any combination thereof.

In a further embodiment, the distortion includes a magnification or orthogonality distortion in the imprint lithographic template or the substrate.

In another aspect, a method comprises providing an imprint lithographic template having an imprint surface that includes at least one protrusion, wherein the at least one protrusion defines a primary surface; providing a substrate holder including a chucking region having a substrate support surface; placing a substrate over the chucking region, wherein the substrate has a primary surface within an imprint region; quantifying a distortion in the substrate, the lithographic template, the imprint apparatus, or any combination thereof; and dispensing a formable material over the primary surface of the substrate based at least in part on the distortion.

In an embodiment, quantifying the distortion comprises determining a deviation in planarity along the primary surface of the imprint lithographic template, the substrate support surface of the chucking region within the imprint region, the primary surface of the substrate within the imprint region, or any combination thereof.

In another embodiment, quantifying the distortion comprises analyzing a magnification or orthogonality error in the imprint lithographic template or the substrate.

In a further embodiment, dispensing the formable material is performed such that the formable material is dispensed to a first areal density within a first area, where the distortion indicates that the at least one protrusion and the primary surface will be further apart when the imprint lithographic template contacts the formable material within the first area; and a second areal density within a second area, where the distortion indicates that the at least one protrusion and the primary surface will be closer to each other when the imprint lithographic template contacts the formable material within the second area, wherein the first areal density is greater than the second areal density.

In a particular embodiment, the first area corresponds to a first protrusion of the imprint lithographic template, and the second area corresponds to a second protrusion of the imprint lithographic template spaced apart from the first protrusion.

In another particular embodiment, the first and second areas correspond to different, spaced-apart areas of a same protrusion.

In a further particular embodiment, the method further comprises determining a dispense pattern for the formable material based at least in part on the deviation, wherein dispensing the formable material is performed using the dispense pattern.

In a more particular embodiment, a third area corresponds to at least one recession within the imprint lithographic template.

In an even more particular embodiment, determining the dispense pattern is performed such that the formable material is dispensed to a third areal density within the third area, wherein the third areal density is greater than each of the first and second areal densities.

In still an even more particular embodiment, determining the dispense pattern is based in part on the deviation in planarity along the primary surface of the imprint lithographic template, the substrate within the imprint region, or both within the third area.

In another embodiment, the method further comprises exposing the formable material to ultraviolet radiation to polymerize the formable material and form a polymer layer, wherein the polymer layer has a first thickness within the first area and a second thickness within the second area, and the first thickness is greater than the second thickness.

In a particular embodiment, the first thickness is at least 5%, at least 11%, or at least 20% thicker than the second thickness, and is at most 200%, at most 150%, or at most 95% thicker than the second thickness.

In another particular embodiment, the method further comprises separating the template from the polymer layer.

In a more particular embodiment, the method further comprises forming an etch-resistant layer within a recession in the polymer layer; removing a portion of the etch-resistant layer that overlies a protrusion in the polymer layer; and removing the protrusion in the polymer layer.

In a further aspect, a method forming an article comprises providing an imprint apparatus comprising a substrate holder including a chucking region having a substrate support surface for a substrate; a template holder for an imprint lithographic template having an imprint surface that includes at least one protrusion; and a processor configured to dispense an amount of a formable material in a particular area based at least in part on a distortion in the substrate, the lithographic template, the substrate holder, or any combination thereof. The method further comprises placing a substrate of the article over the chucking region, wherein the substrate has a primary surface within an imprint region; quantifying a distortion in the substrate, the lithographic template, the imprint apparatus, or any combination thereof; and dispensing a formable material over the primary surface of the substrate based at least in part on the distortion.

Other features and advantages of the present invention will be apparent from the accompanying drawings and from the detailed description that follows.

BRIEF DESCRIPTION OF THE DRAWINGS

Embodiments are illustrated by way of example and are not limited in the accompanying figures.

Figure 1:
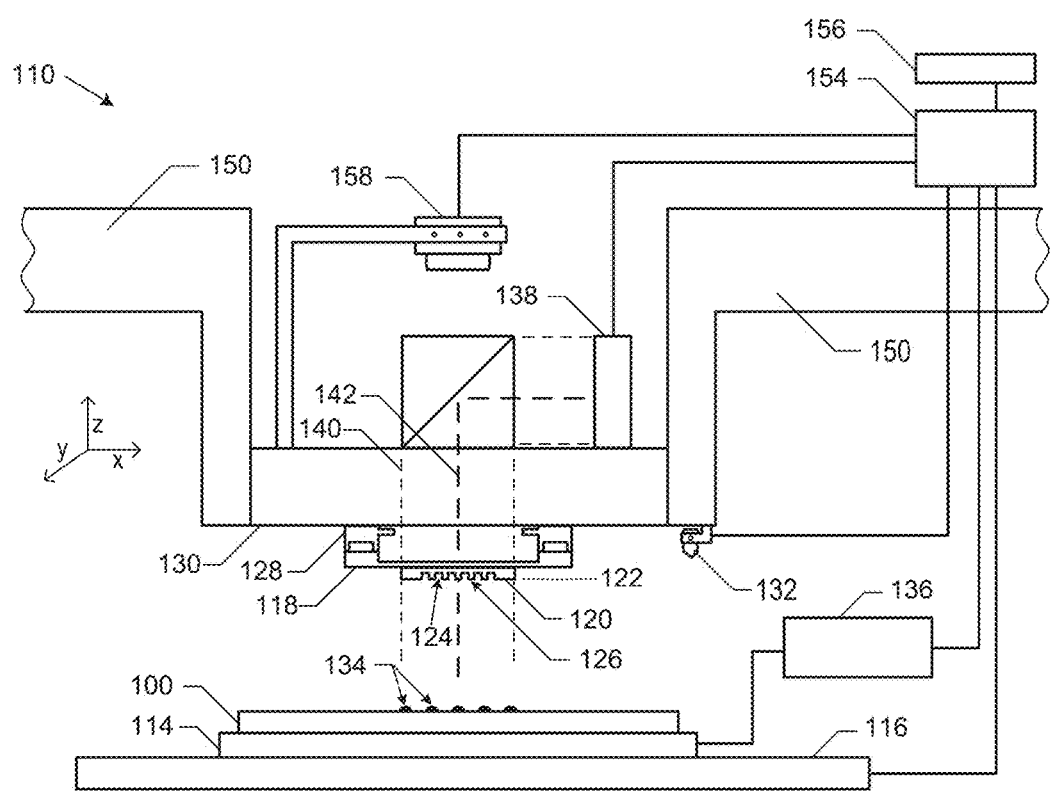
FIG. 1 includes a conceptual view of an imprint apparatus.

Skilled artisans appreciate that elements in the figures are illustrated for simplicity and clarity and have not necessarily been drawn to scale. For example, the dimensions of some of the elements in the figures may be exaggerated relative to other elements to help to improve understanding of embodiments of the invention.

DETAILED DESCRIPTION

The following description in combination with the figures is provided to assist in understanding the teachings disclosed herein. The following discussion will focus on specific implementations and embodiments of the teachings. This focus is provided to assist in describing the teachings and should not be interpreted as a limitation on the scope or applicability of the teachings. However, other embodiments can be used based on the teachings as disclosed in this application.

As used herein, the terms "comprises," "comprising," "includes," "including," "has," "having" or any other variation thereof, are intended to cover a non-exclusive inclusion. For example, a method, article, or apparatus that comprises a list of features is not necessarily limited only to those features but may include other features not expressly listed or inherent to such method, article, or apparatus. Further, unless expressly stated to the contrary, "or" refers to an inclusive-or and not to an exclusive-or. For example, a condition A or B is satisfied by any one of the following: A is true (or present) and B is false (or not present), A is false (or not present) and B is true (or present), and both A and B are true (or present).

Also, the use of "a" or "an" is employed to describe elements and components described herein. This is done merely for convenience and to give a general sense of the scope of the invention. This description should be read to include one, at least one, or the singular as also including the plural, or vice versa, unless it is clear that it is meant otherwise. For example, when a single item is described herein, more than one item may be used in place of a single item. Similarly, where more than one item is described herein, a single item may be substituted for that more than one item.

Unless otherwise defined, all technical and scientific terms used herein have the same meaning as commonly understood by one of ordinary skill in the art to which this invention belongs. The materials, methods, and examples are illustrative only and not intended to be limiting. To the extent not described herein, many details regarding specific materials and processing acts are conventional and may be found in textbooks and other sources within the imprint and lithography arts.

An imprint apparatus and method can be used to at least partially compensate for a distortion within an imprint system. The distortion may come from a substrate, an imprint lithographic template, the imprint apparatus, or any combination thereof. The distortion can include a pattern distortion of the mold or a distortion on the substrate due to an image placement error, or a deviation in planarity of a substrate support surface of a chucking region of a substrate holder or template holder, a primary or chucked surface of a substrate, a primary or chucked surface of a mold of a template, or any combination thereof. In an embodiment, the substrate can be in the form of a wafer.

For example, when a substrate is placed over the chucking region, the exposed surface of the substrate may exhibit in-plane distortion due to deviation from planarity of the chuck that can result in a significant overlay difference between an imprinted layer being formed and a previously-formed patterned layer within the substrate. The in-plane distortion of the substrate due to the deviation from planarity of the chuck is due to substrate conforming to the chuck during the vacuum chucking. The flatness of exposed surface can be measured, and a dispense pattern for a formable material can be adjusted to cause an intentional or programmed deviation from planarity of the mold in an opposite direction to allow for improved registration to the patterned layer within the substrate. The deviation in planarity caused by substrate chuck causes in-plane distortion of the substrate. This in-plane distortion is then created on the mold by an intentional or programmed deviation from planarity. This programmed deviation, though shown as equal and opposite in FIG. 7, can vary depending, among other things, on the thickness and material properties of the mold and substrate. This in-plane distortion matching leads to improved overlay which in turn affects device yield. The image placement error or in-plane distortion compared to an ideal grid of points will be present to an equal degree on both the mold and substrate.

The residual layer of the resulting imprinted polymer layer has an acceptable amount of nonuniformity (for example, the residual layer can be removed without eroding too much of the protrusions). If the amount of nonuniformity is too high, a reverse image with an etch-resistant layer can be used. For the reverse image process, protrusions of the polymer layer can be removed, leaving portions of the residual layer covered by the etch-resistant layer. Thus, the method is flexible enough to account for residual layers with different amounts of nonuniformity. The apparatus and method can be used in forming any patterned layer, and is particularly well suited for patterned layers with very small dimensions, such as 30 nm and smaller.

Another example is the case where the deviations in planarity are not significant but the mold has a pattern distortion or the substrate has a distortion due to an image placement error in a previously patterned field. The distortion can include a magnification distortion as well as an orthogonality distortion, such as a skew distortion or a trapezoidal distortion. Such distortion can be measured and is available for analysis. By creating the aforementioned programmed deviation from planarity of the mold with the formable layer, an in plane distortion can be created that reduces an overlay error that would otherwise occur due to the distortion in the mold or substrate. The distortion can be quantified, and the dispense pattern is adjusted accordingly. The apparatus and methods are better understood after reading this specification in conjunction with the figures.

FIG. 1 illustrates a nanoimprint lithography system 110 that can be used to form a relief pattern on the substrate 100. The substrate 100 can be coupled to a substrate holder 114. As illustrated, the substrate holder 114 is a vacuum chuck. The zones within the substrate holder 114 can be in fluid communication with a gas controller 136. Alternatively, the substrate holder 114 may be any chuck including vacuum, pin-type, groove-type, electrostatic, electromagnetic, and/or the like. Exemplary chucks are described in U.S. Pat. No. 6,873,087, which is hereby incorporated by reference herein in its entirety.

The substrate 100 and substrate holder 114 can be further supported by a stage 116. The stage 116 can provide translational motion, rotational motion, or both translational and rotational motion along the x, y, and z-axes. The stage 116, the substrate 100, and the substrate holder 114 may also be positioned on a base (not illustrated).

A template 118 is spaced-apart from the substrate 100. The template 118 can include a body having opposing sides with one of the opposing sides having a mold 120, which corresponds to in size to a full field, having a patterning surface 122 extending therefrom towards the substrate 100. In an embodiment, the mold 120 can be in the form of a mesa. In another embodiment, the template 118 does not include the mesa.

In an embodiment, the template 118, the mold 120, or both are formed from a material including fused-silica, quartz, silicon, an organic polymer, a siloxane polymer, borosilicate glass, a fluorocarbon polymer, metal, hardened sapphire, another suitable material that can be molded, machined, or etched into a desired shape, or any combination thereof. As illustrated, the patterning surface 122 includes features defined by a plurality of spaced-apart recesses 124, protrusions 126, or any combination of recesses and protrusions, though embodiments are not limited to such configurations. In an alternative embodiment, the patterning surface has a planar surface. The patterning surface 122 defines a pattern that forms the basis of a corresponding pattern to be formed on the substrate 100.

In the illustrated embodiment, the template 118 is coupled to a template chuck 128. The template chuck 128 may be configured as a vacuum, pin-type, groove-type, electrostatic, electromagnetic, another suitable chuck type, or any combination thereof. Exemplary chucks are further described in U.S. Pat. No. 6,873,087. In the embodiment as illustrated, the chuck 128 is coupled to an imprint head 130, such that the template chuck 128, the imprint head 130, or both are configured to facilitate movement of the template 118 and the substrate 100 relative to each other. The imprint head 130 is coupled to a frame 150.

The system 110 can further include a fluid dispense system 132. The fluid dispense system 132 is used to deposit a formable material 134 on the substrate 100. In a particular embodiment, the formable material can be a polymerizable material. In the embodiment as illustrated, the formable material 134 is positioned upon the substrate 100 using a technique, such as, drop dispense, spin-coating, dip coating, chemical vapor deposition (CVD), physical vapor deposition (PVD), thin film deposition, thick film deposition, or any combination thereof. The formable material 134 is disposed upon the substrate 100 before, after, or both before and after a desired volume is defined between the patterning surface 122 and the substrate 100, depending on design considerations. Details regarding the dispense pattern are described in more detailed description later in this specification.

The system 110 further includes an energy source 138 coupled to direct energy 140 along a path 142. The system 110 also includes a camera 158 that can monitor image spread of the material 134, separation of the template 118, or both the image spread of the material 134 and separation of the template 118 once the patterned layer is formed on substrate 100. The imprint head 130 and the stage 116 can be configured to position the template 118 and the substrate 100 in superimposition with the path 142. In the embodiment as illustrated, the system 110 is controlled at least in part by a processor 154 in communication with the stage 116, the imprint head 130, the fluid dispense system 132, energy source 138, or any combination thereof, and may operate on a computer readable program stored in a memory 156. In another embodiment, the processor 154 may be located external to the system 110. In still another embodiment, functions described with respect to the processor 154 can be performed by more than one processor, wherein at least one processor is internal to the system 110 and at least one other processor is external to the system 110. After reading this specification, skilled artisans will be able to configure an imprint lithography system that is tailored to the needs or desires for a particular application.

Figure 2:
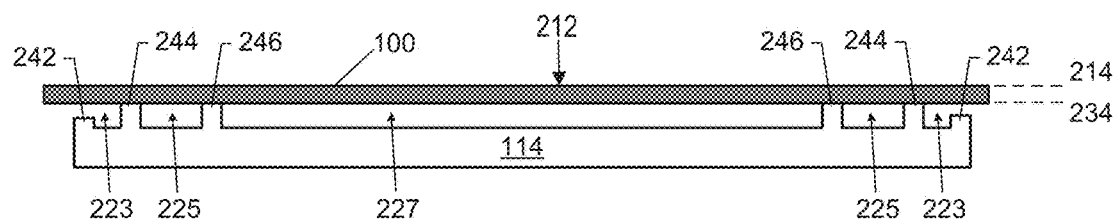
FIG. 2 includes an illustration of a cross-sectional view of a substrate overlying a chucking region of a substrate holder of the imprint apparatus of FIG. 1.

FIG. 2 includes an illustration of a portion of the substrate chuck 114 that includes a chucking region and the substrate 100 to illustrate positional relationships between the chucking region and the substrate 100. The chucking region includes an outer zone 223, an intermediate zone 225, and a central zone 227, wherein the intermediate zone 225 is disposed between the outer zone 223 and the central zone 227. Each of the zones 223, 225, and 227 is defined in part by a recessed land 242 and full-height lands 244 and 246. In a particular embodiment, each of the lands 242, 244, and 246 are continuous, and thus, the lands 242, 244, and 246 are concentric. The outer zone 223 is laterally defined by the lands 242 and 244, the intermediate zone 225 is laterally defined by the lands 244 and 246, and the central zone 227 is laterally defined by the land 246. Within any one or more of zones 223, 225, and 227, one or more pins (not illustrated) may be present to assist with support of the substrate 100, if needed or desired. In another embodiment, the recessed land 242 can be replaced by a full-height land.

A primary surface of a chucking region of the substrate chuck 114 is defined by the top surfaces of the full-height lands 244 and 246 and lies along a plane 234. A primary surface 212 of the substrate 100 lies along a plane 214. In theory, the primary surfaces of the chucking region and the substrate 100 are perfectly flat and have no deviation in planarity. In practical application, the primary surfaces of the chucking region, the substrate 100, or both can have at least some deviations in planarity. When the substrate 100 is placed over the chucking region, the exposed primary surface of the substrate 100 may have a deviation in planarity that is different from the deviation in planarity along the primary surface of the chucking region or substrate 100. In an embodiment, the deviation in planarity can be determined by measuring flatness, and an exemplary tool for measuring can include an interferometer, a profilometer, or the like.

Figure 3:
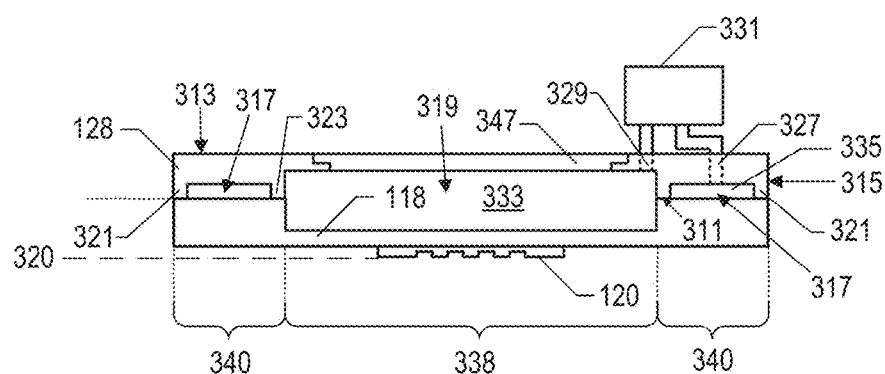
FIG. 3 includes an illustration of a cross-sectional view of a template held by a template holder of the imprint apparatus of FIG. 1.

Referring to FIGS. 1 and 3, the template 118 is coupled to the template chuck 128. The template chuck 128 includes opposing sides 311 and 313. A side, or edge, surface 315 extends between the opposing sides 311 and 313. The side 311 includes a recess 317 and a recess 319, spaced apart from the recess 317, defining spaced-apart support regions 321 and 323. The support region 321 cinctures support region 323 and the recesses 317 and 319. The support region 323 cinctures the recess 319. In a further embodiment, support regions 321 and 323 are formed from a compliant material. In a particular embodiment, the support region 321 has a square shape, and the support region 323 has a circular shape; however, in a further embodiment, the support regions 321 and 323 can include any geometric shape desired. A portion 347 of template chuck 128 is in superimposition with the recess 319 and can be transparent to radiation having a predetermined wavelength or a range of wavelengths. The portion 347 can include a thin layer of transparent material, such as glass. However, the material of the portion 347 may depend upon the wavelength of radiation emitted by the energy source. The portion 347 extends between the side 313 and terminates proximate to the recess 319. The portion 347 has an area at least as large as an area of mold 120 so that mold 120 is in superimposition therewith.

The template chuck 128 includes throughways 327 and 329. In an alternative embodiment, the template chuck 128 may have a different number of throughways. The throughway 327 places the recess 317 in fluid communication with the surface 313; however, in a further embodiment, the throughway 327 places the recess 317 in fluid communication with any surface of template chuck 128. The throughway 329 places the recess 319 in fluid communication with the side 313; however, in a further embodiment, the throughway 329 places the recess 319 in fluid communication with any surface of template chuck 128. The throughways 327 and 329 can facilitate placing the recesses 317 and 319, respectively, in fluid communication with a pressure control system, such as a pump system 331.

The pump system 331 may include one or more pumps to control the pressure proximate to the recesses 317 and 319. To that end, when the template 118 is coupled to the template chuck 128, the template 118 rests against the support regions 321 and 323, covering the recesses 317 and 319. A flexible region 338 of the template 118 may be in superimposition with the recess 319, defining a chamber 333 and a thicker region 340 of the template 118 may be in superimposition with recess 317, defining a chamber 335. The pump system 331 operates to control a pressure in the chambers 333 and 335.

In theory, the primary surface 320 of the mold 120 is perfectly flat and has no deviation in planarity. In practical application, the primary surfaces of the mold 120 can have at least some deviation in planarity. In an embodiment, the deviation in planarity can be obtained by measuring flatness, and an exemplary tool for measuring can include an interferometer, a profilometer, or the like.

Below is a description of an exemplary method that can account for deviations in planarity and allow for better overlay between a patterned layer being formed from the formable material and a previously-formed patterned layer in the substrate 100. While many details are described with respect to a particular embodiment, the scope of the appended claims is not limited only to the embodiments described. For example, more, fewer, or other actions may be performed without deviating from the concepts as described herein. After reading this specification in its entirety in conjunction with the figures, skilled artisans will appreciate that other modifications can be made without deviating from the scope of the present invention.

Figure 4:
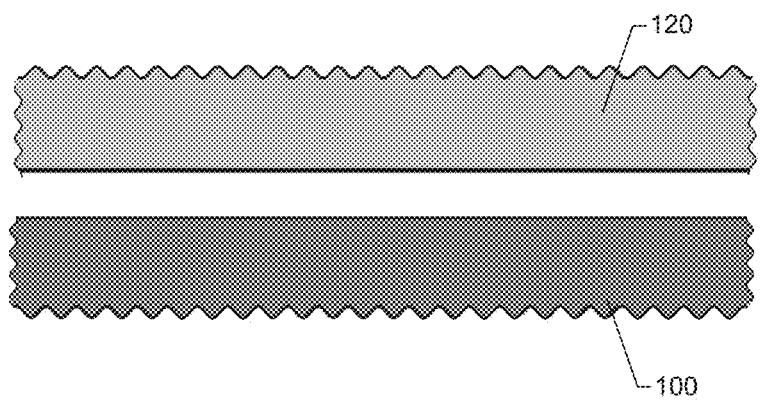
FIG. 4 includes a side view of portions of the substrate and a mold of the template.

FIG. 4 illustrates a substrate 100 and the mold 120 of the template 118. For simplicity, the mold 120 is illustrated as an unpatterned surface, so that the deviation in planarity along the primary surface of the mold 120 is insignificant in this particular embodiment. Similarly, the primary surface of the substrate 100 is illustrated as having a deviation in planarity that is insignificant in this particular embodiment.

Figure 5:
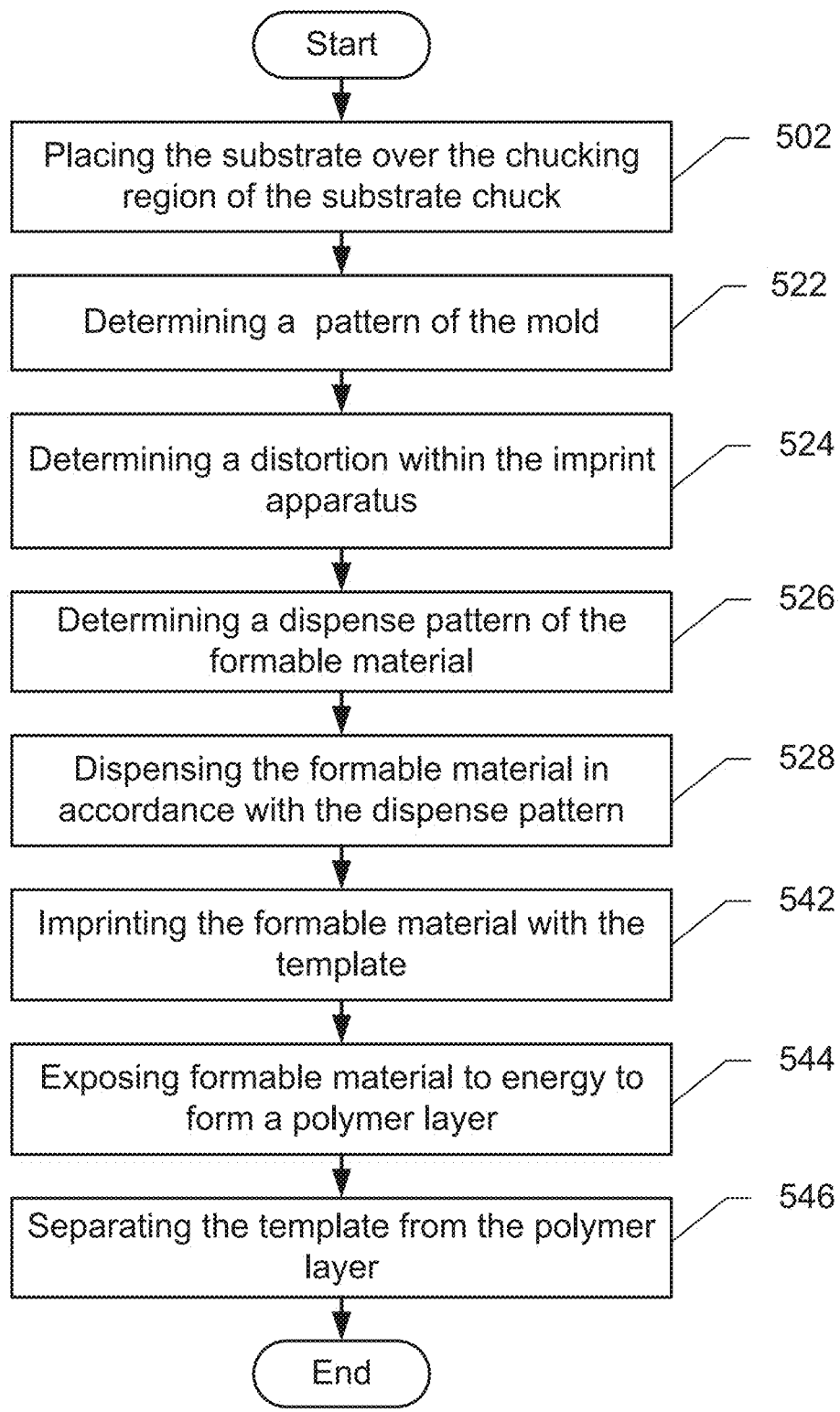
FIG. 5 includes a process flow for forming an imprinted layer using the imprint apparatus of FIG. 1.
Figure 6:
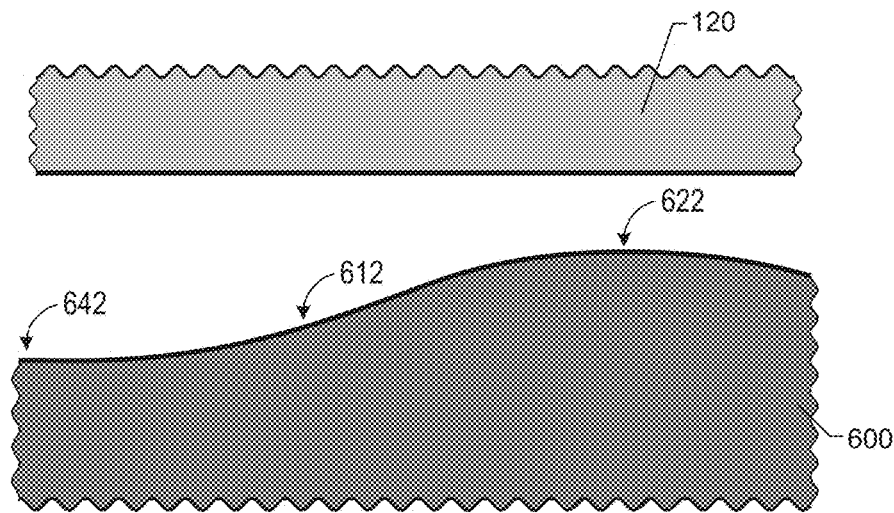
FIG. 6 includes a side view of portions of the substrate, the chucking region of the substrate holder, and the mold of the template.

The method is further described with respect to FIGS. 1 and 5. The method can include placing the substrate 100 on the chucking region of the substrate chuck 114, at block 502 of FIG. 5. FIG. 6 illustrates a combination of the substrate 100 and chucking region of the substrate chuck 114 as an object 600. Thus, the exposed surface 612 of the object corresponds to the primary surface 212 of the substrate 100 when placed on the chucking region. In this embodiment, the chucking region distorts the shape of the substrate 100, resulting in a significant deviation in planarity. Location 622 lies at an elevation that is higher than the average elevation of the exposed surface 612, and location 642 lies at an elevation that is lower than the average elevation of the exposed surface 612. The deviation in planarity of the exposed surface 612 can result in an in-plane distortion of a patterned layer already present within the substrate 100, to which the mold 120 is to be aligned.

As will be described below, the dispense pattern for the formable material will, at least in part, account for the distortion within the imprint system. Before determining the dispense pattern, information needs to be collected. The method can include determining a pattern of the mold 120, at block 522. The pattern corresponds to the protrusions and recessions on the mold 120 as previous described. This determination can be made using the Graphics Data System (GDS) file used in designing and forming the mold 120. A higher areal density of formable material will be dispensed at locations where recessions in the mold 120 are present, and a lower areal density of formable material will be dispensed at locations where protrusions in the mold 120 are present.

The method can include quantifying a distortion within the imprint system, at block 524. The imprint system can include the substrate 100, the template 118, and the apparatus. Quantifying the distortion can include determining a deviation in planarity along a surface of a component within the imprint apparatus. The deviation in planarity may be measured as flatness along the primary surface of the chucking region, the primary surface 212 of the substrate 100, along the primary surface of the mold 120, or any combination thereof. In the embodiment as illustrated in FIG. 6, flatness is measured along the primary surface 212 of the substrate 100 when it is over the chucking region of the substrate chuck 114. The flatness may be measured for the entire or nearly the entire substrate 100 (for example, all imprint fields), a single imprint field, a selected combination of imprint fields (for example, the particular imprint field and immediately adjacent imprint fields), or the like. For regions that are lower in elevation, a higher areal density of formable material will be dispensed, and for regions that are higher in elevation, a lower areal density of formable material will be dispensed. The reasoning behind the difference in areal density will be described later in this specification.

Another distortion can be a magnification or orthogonality distortion. In a particular embodiment, a previously formed pattern in the substrate 100 may be too small or too large as compared to the mold of the template 118. Such magnification distortions can be quantified by comparing the outer dimensions of the previously formed pattern in the substrate 100 to the outer dimensions of the mold. If the previously formed pattern is too small relative to the mold of the template 118, a higher density of formable material can be dispensed near the center, as compared to the periphery, of the imprint field to cause the mold to have a concave surface, which reduces the size of the field to be printed within the formable material. If the previously formed pattern is too large relative to the mold of the template 118, a higher density of formable material can be dispensed near the periphery, as compared to the center, of the imprint field to cause the mold to have a convex surface, which increases the size of the field to be printed within the formable material. Similar approaches can be undertaken to correct for orthogonality distortions, such as skew and trapezoidal distortions.

The method can further include determining a dispense pattern for the formable material, at block 526. Information regarding the pattern of the mold 120, distortion within the system, and potentially other information is received by the processor 154 from the memory 156, a metrology tool (for example, an interferometer, a profilometer, or the like), from an external source (for example, a GDS file is in an external memory, not illustrated), state information during exposure (temperature, humidity, energy source, areal energy density during exposure, or the like) or other suitable information that can affect patterning for the formable material.

The information related to the pattern of the mold 120 will affect more greatly the dispense pattern as compared to the distortion. However, the distortion still affects significantly the dispense pattern, particularly where the residual layer will be formed. The areal density of the dispense pattern for a region can be a combination of an areal density corresponding to a protrusion or a recession (depending on the feature of the mold 120 corresponding to the region) and an areal density corresponding to the flatness of that region.

The method can include dispensing the formable material in accordance with the dispense pattern, at block 528. After the dispense pattern is determined, the processor 154 can send instructions or signals to the fluid dispense system 132 to dispense the formable material on the primary surface of the substrate 100 to achieve the desired areal densities at different regions along the primary surface.

Figure 7:
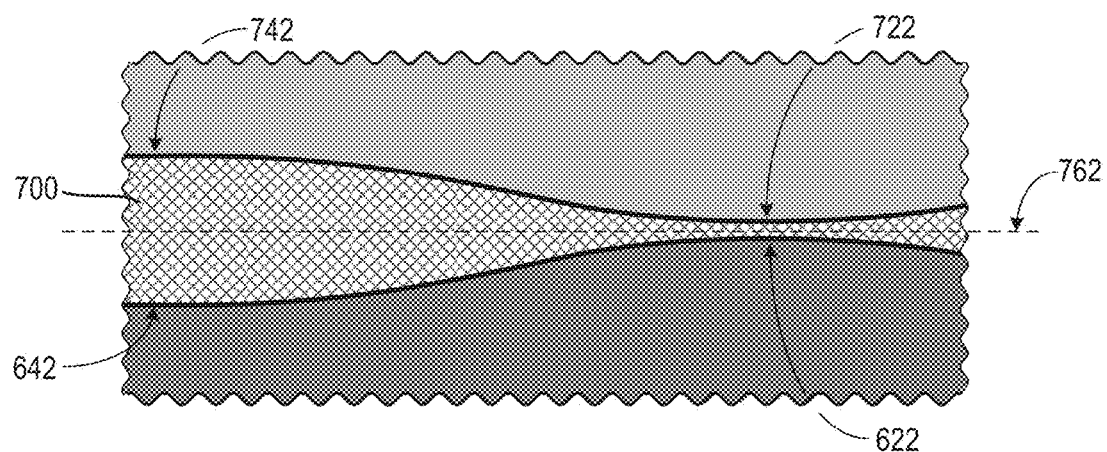
FIG. 7 includes a side view of portions of the substrate, the chucking region, and the mold during an imprint operation with a formable material.

The method can include imprinting the formable material with the template 118, at block 542. FIG. 7 includes an illustration of a portion of the object 600 (combination of the chucking region and substrate 100) at a region where there is a protrusion in the mold 120 and the residual layer is being formed. Thus, FIG. 7 does not illustrate a recession in the mold 120 or a protrusion in the formable material 700 corresponding to the recession in the mold 120, although such a recession-protrusion combination may be present. Locations 622 and 642 of the substrate have corresponding locations 722 and 742 of the template. As can be seen in FIG. 7, a line 762 bisects the thickness of formable material 700, such that the formable material has a mirror image about the line 762. This mirror image is three-dimensional. That is, while FIG. 7 shows a cross-section of the imprint, it is to be understood that the shape of the mold and substrate as shown could change across the imprint region, depending on the local flatness. Hence, the mirror image with respect to the formable material 700 can help to reduce or cancel out the effect of the distortion along the exposed surface 612 to improve overlay in the pattern that will be formed with the formable material 700 to an already existing patterned layer with the substrate 100. The significance of the non-uniformity will become more apparent later in this specification.

The method can further include exposing the formable material to energy to form a polymer layer, at block 544 of FIG. 5. Referring to FIG. 1, the composition of the formable material is selected to cross-link or polymerize to form the polymer layer when exposed to energy 140 from the energy source 138. In an embodiment, the energy source 138 emits radiation, and the formable material can include an activator that responds to the radiation. In a particular embodiment, the radiation is ultraviolet light. In another embodiment, a different composition of the formable material can be used that responds to different radiation, such as x-rays or visible light. The shape of the polymer layer is substantially the same as the formable material when in contact with the mold 120.

The method can include separating the template 118 from the polymer layer, at block 546 of FIG. 5. Many different techniques for separating are known to skilled artisans. After reading this specification, skilled artisans will be able to select a particular separation technique that meets the needs or desires for a particular application.

A benefit of embodiments as described is improved overlay between an imprinted layer and an underlying patterned layer within the substrate 100. Manufacturing technology can limit flatness that can be achieved for the chucking region of the substrate holder 114, the substrate 100, or both. The result can be out of plane non-flatness that can result in an in-plane distortion in the substrate 100. Before the invention, nanoimprint technology was performed, such that the residual layer was to be kept as thin and uniform as possible, so that the residual layer could be more easily removed without removing too much of the thickness (height) of the protrusions within the polymer layer. When the exposed surface 612 is not planar, a uniform, thin residual layer can make problems worse because the non-planar exposed surface 612 causes an in-plane distortion in the template 118 that is opposite in sign to that on the substrate 100. The resulting overlay, which is the difference between the two in-plane distortions, is thus a function of the flatness of the chucking region of the template 118, and substrate, or both.

Contrary to conventional teachings, the method causes a complementary out-of-plane distortion that helps to cancel out the affects of the in-plane distortion along the exposed surface 612. Therefore, overlay error due to the deviation in planarity of the exposed surface 612 can be reduced or substantially eliminated. Thus, the patterned polymer layer is more accurately aligned to one or more of the underlying patterned layers.

In an embodiment where the substrate 100 is a semiconductor wafer and the polymer layer has a pattern, the residual layer thickness may have a nominal thickness of 15 nm, and the protrusions can be in a range of 45 nm to 60 nm. The residual layer thickness can range from 10% to 90% of its average thickness or range from 5 nm to 95 nm. Conventionally, the residual layer would have had a thickness in range from 10% to 30% of its average thickness or range from 5 nm to 30 nm. Thus, the process as described herein can result in a significant increase in non-uniformity in the thickness of the residual layer, which is contrary to conventional wisdom. However, many times, the increased non-uniformity of the residual layer is not a problem.

Figure 8:
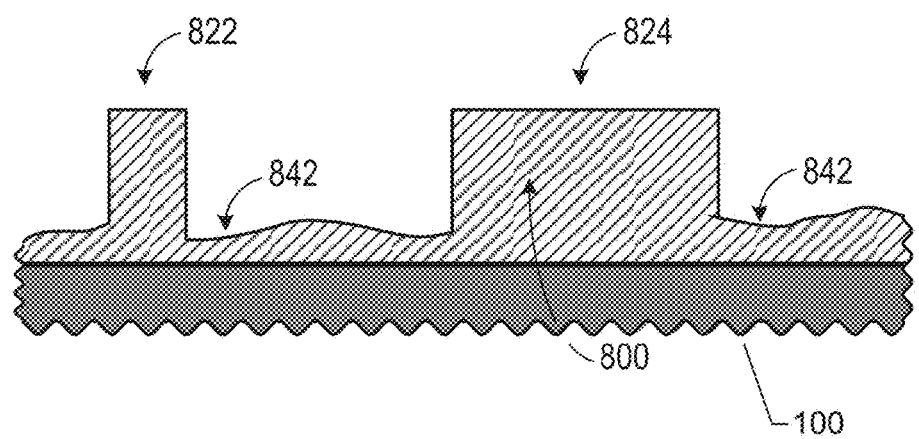
FIG. 8 includes an illustration of a cross-sectional view of a portion of a workpiece including the substrate and an imprinted polymer layer.
Figure 9:
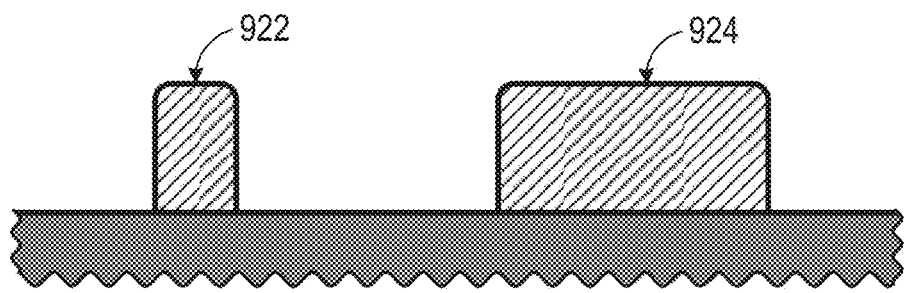
FIG. 9 includes an illustration of a cross-sectional view of the portion of the workpiece of FIG. 8 after removing the residual layer of the imprinted polymer layer.

In an embodiment, FIGS. 8 and 9 include illustrations of cross-sectional views of portions of the substrate 100 and the polymer layer 800 after the formable material 700 is exposed and the mold 120 is removed. In FIG. 8, the polymer layer 800 includes protrusions 822 and 824 and a residual layer 842 at regions surrounding the protrusions 822 and 824. Before the imprinted polymer layer 800 can be used as a mask, the residual layer 842 is removed. As illustrated in FIG. 8, the residual layer 842 is illustrated as having some distortion; however, the degree of distortion is not too great. Thus, the residual layer 842 can be removed without removing too much of the protrusions 822 and 824. The polymer layer can be an organic compound and be removed with an oxygen-containing gas, for example $O_2$, $O_3$, $N_2O$, or the like.

In an embodiment, the residual layer 842 may be removed using an anisotropic etch to help maintain the lateral dimensions of the protrusions 822 and 824. In a particular embodiment, the etch can be performed using reactive ion etching. The etch may be performed as a timed etch, using endpoint detection (based on a signal indicating the substrate 100 is exposed), or endpoint detection with a timed overetch. FIG. 9 includes an illustration of the protrusions 922 and 924 after the residual layer 842 is removed. The protrusions 922 and 924 are substantially the same as the protrusions 822 and 824 except that the protrusions 922 and 924 have rounded upper corners.

Figure 10:
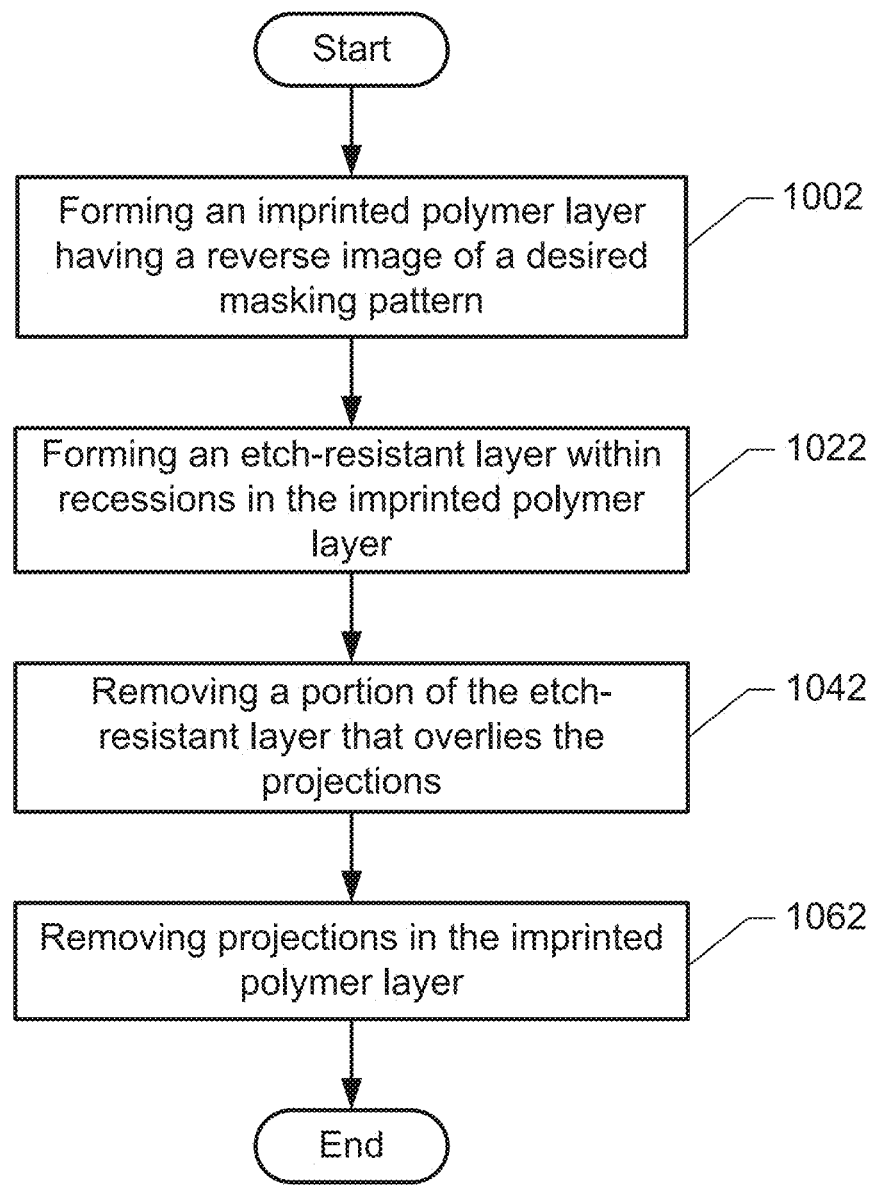
FIG. 10 includes a process flow for forming an imprinted layer using the imprint apparatus of FIG. 1 in accordance with an alternative embodiment.

In an embodiment where the thickness of the residual layer varies too much, the process may be modified to achieve the same masking pattern. In this embodiment, the formable material 700 is imprinted with a mold having a reverse image of the pattern that is used to form the pattern as previously described with respect to the embodiment as illustrated in FIGS. 8 and 9. FIG. 10 includes a process flow for achieving such a masking pattern, as illustrated in FIGS. 11 to 14.

Figure 11:
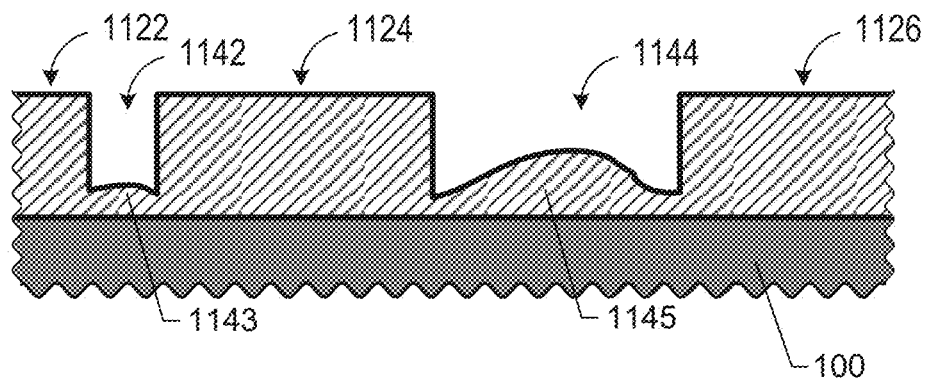
FIG. 11 includes an illustration of a cross-sectional view of a portion of a workpiece including the substrate and an imprinted polymer layer.

The method includes forming an imprinted polymer layer having a reverse image of a desired masking pattern, at block 1002 in FIG. 10. FIG. 11 includes a cross-sectional view of a portion of a workpiece that includes the substrate 100 and an imprinted polymer layer 1100 over the substrate 100. The imprinted polymer layer 1100 is formed using a technique as previously described with respect to the process in FIG. 5. In this particular embodiment, the degree of distortion is significantly greater as compared to the polymer layer 800 in FIG. 8. The imprinted polymer layer 1100 has protrusions 1122, 1124, and 1126 where portions of the residual layer 842 are seen in FIG. 8, and recessions 1142 and 1144 in FIG. 11 where protrusions 822 and 824 are seen in FIG. 8. Portions 1143 and 1145 of the residual layer lie along the bottom of the recessions 1142 and 1144, respectively. The residual layer is significantly more nonuniform in thickness, and in particular, portion 1145. If such a nonuniform thickness would have been formed with the residual layer 842 in FIG. 8, too much of the protrusions 822 and 824 may have been removed when the residual layer 842 is removed. The resulting masking layer would have protrusions 822 and 824 that may have had heights (thicknesses) that are insufficient to withstand a subsequent etching operation. The reverse image process allows the residual layer to be more nonuniform and still provide a sufficiently robust masking pattern.

Figure 12:
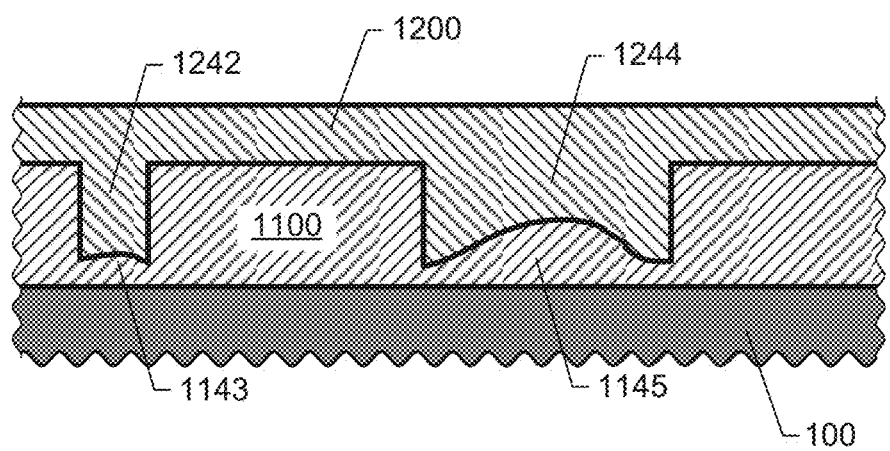
FIG. 12 includes an illustration of a cross-sectional view of a portion of the workpiece of FIG. 11 after forming an etch-resistant layer.

The method can further include forming an etch-resistant layer 1200 within recessions in the imprinted polymer layer 1100, at block 1022 in FIG. 10. In FIG. 12, the etch-resistant layer 1200 is formed over the imprinted polymer layer 1100 and includes portions 1242 and 1244 that are formed within the recessions 1142 and 1144 (FIG. 11) and over the portions 1143 and 1145 of the imprinted polymer layer 1100. In the embodiment illustrated, all of the imprinted polymer layer 1100, including the protrusions 1122 and 1124. In another embodiment, little or none of the etch-resistant layer 1200 is formed over the protrusions 1122, 1124, and 1126.

The composition of the etch-resistant layer 1200 is selected such that the imprinted polymer layer 1100 can be selectively etched as compared to the etch-resistant layer 1200. In a particular embodiment, the imprinted polymer layer 1100 can include an organic polymer, and the etch-resistant layer 1200 can include a silicon-containing compound. In a particular embodiment, the imprinted polymer layer 1100 can be an organic polymer having a carbon backbone. In another particular embodiment, the etch-resistant layer 1200 can be a polymer having a silicon backbone, such as a polysiloxane.

Figure 13:
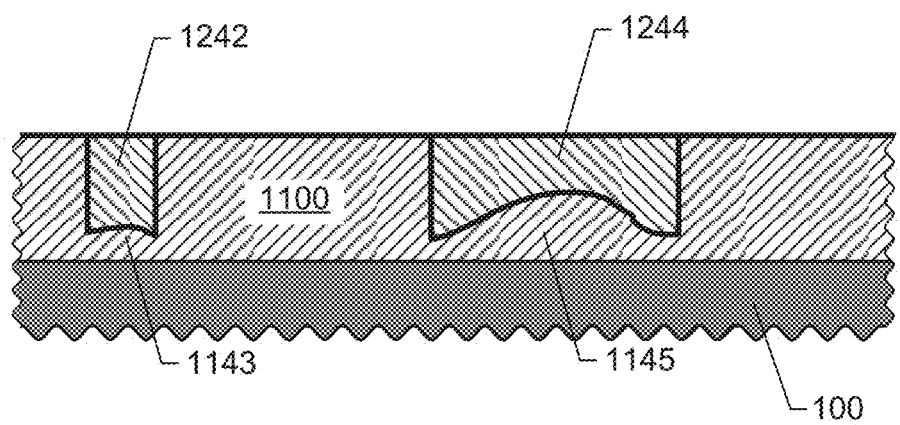
FIG. 13 includes an illustration of a cross-sectional view of a portion of the workpiece of FIG. 12 after removing a portion of the etch-resistant layer to expose portions of the imprinted polymer layer.

The method can include removing a portion of the etch-resistant layer 1200 that overlies the protrusions 1122, 1124, and 1126, at block 1042 in FIG. 10. In FIG. 13, the portion of the etch-resistant layer 1200 can be removed by etching the etch-resistant layer 1200 with an etchant that can etch the material of the etch-resistant layer 1200. When the etch-resistant layer 1200 includes silicon, a fluorine-based etchant can be used. The etch may be an isotropic or anisotropic etch. For dry etching, a gas such as $CF_4$, $CHF_3$, $SF_6$, or the like may be used. For wet etching, a buffered HF solution (including $NH_4F$) may be used. The etch may be performed as a timed etch, using endpoint detection (based on a signal indicating the imprinted polymer layer 1100 is exposed), or endpoint detection with a timed overetch.

The method can further include removing the protrusions 1122, 1124, and 1126 in the imprinted polymer layer 1100, at block 1062 in FIG. 10. The protrusions 1122, 1124, and 1126 of the imprinted polymer layer 1100 can be removed using any of the techniques and gases as previously described with respect to removing the residual layer 842. A masking member 1442 includes portion 1143 of the imprinted polymer layer 1100 and portion 1242 of the etch-resistant layer 1200, and a masking member 1444 includes portion 1145 of the imprinted polymer layer 1100 and portion 1244 of the etch-resistant layer 1200.

Figure 14:
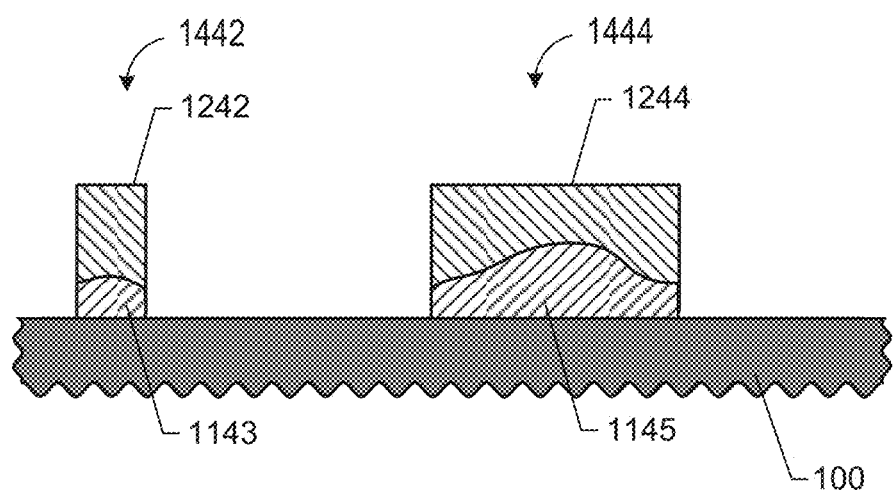
FIG. 14 includes an illustration of a cross-sectional view of a portion of the workpiece of FIG. 13 after removing the exposed portions of the imprinted polymer layer.

When comparing FIGS. 9 and 14, the masking pattern is the same, even though the composition of the masking members may be different. Thus, even if the resulting residual layer does not have a sufficiently uniform thickness, a masking pattern with good overlay characteristics can be achieved.

Embodiments as described herein allow for better overlay even when the chucking region of the substrate holder 114, the substrate 100, the mold 120 of the template 118, or any combination thereof have a significant distortion within the system. For a deviation in planarity, the flatness of any of the chucking region, an exposed surface of the substrate 100 when on the chucking region, or mold 120 may be measured. For other distortions, the distortions likewise may be quantified. The dispense pattern for the formable material can be adjusted to correct for distortion that would otherwise result if the dispense pattern were not adjusted for the distortion. As the smallest dimensions being formed decreases, such adjustments that are desirable may become needed to achieve proper alignment between critical layers, such as between field and gate levels, between gate and contact levels, or the like. In another embodiment, the adjustment in the dispense pattern may be used for only some and not all of the patterning sequences. For example, alignment tolerance for well regions, such as n-well regions or p-well regions, and bond pads are sufficiently large and do not require as much precision as compared to the field, gate, and contact levels.

Many different aspects and embodiments are possible. Some of those aspects and embodiments are described below. After reading this specification, skilled artisans will appreciate that those aspects and embodiments are only illustrative and do not limit the scope of the present invention.

Note that not all of the activities described above in the general description or the examples are required, that a portion of a specific activity may not be required, and that one or more further activities may be performed in addition to those described. Still further, the order in which activities are listed is not necessarily the order in which they are performed.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

The specification and illustrations of the embodiments described herein are intended to provide a general understanding of the structure of the various embodiments. The specification and illustrations are not intended to serve as an exhaustive and comprehensive description of all of the elements and features of apparatus and systems that use the structures or methods described herein. Separate embodiments may also be provided in combination in a single embodiment, and conversely, various features that are, for brevity, described in the context of a single embodiment, may also be provided separately or in any subcombination. Further, reference to values stated in ranges includes each and every value within that range. Many other embodiments may be apparent to skilled artisans only after reading this specification. Other embodiments may be used and derived from the disclosure, such that a structural substitution, logical substitution, or another change may be made without departing from the scope of the disclosure. Accordingly, the disclosure is to be regarded as illustrative rather than restrictive.

What is claimed is:

1. A method comprising:
providing an imprint lithographic template having an imprint surface that includes at least one protrusion, wherein the at least one protrusion defines a primary surface;
providing a substrate holder including a chucking region having a substrate support surface;
placing a substrate over the chucking region, wherein the substrate has a primary surface within an imprint region;
quantifying a distortion in the substrate, a deviation in planarity along the primary surface of the lithographic template, a deviation in planarity along a surface of a component within the imprint apparatus, or any combination thereof, wherein quantifying the distortion comprises determining a deviation in planarity along the primary surface of the substrate support surface of the chucking region within the imprint region, the primary surface of the substrate within the imprint region, or any combination thereof; and
dispensing a formable material over the primary surface of the substrate based at least in part on the distortion in the substrate, the deviation in planarity along the primary surface of the lithographic template, a deviation in planarity along the surface of the component within the imprint apparatus, or any combination thereof, wherein dispensing the formable material is performed such that the formable material is dispensed to:
a first areal density within a first area, where the deviation indicates that the at least one protrusion and the primary surface will be further apart when the imprint lithographic template contacts the formable material within the first area; and
a second areal density within a second area, where the deviation indicates that the at least one protrusion and the primary surface will be closer to each other when the imprint lithographic template contacts the formable material within the second area, wherein the first areal density is greater than the second areal density.

2. The method of claim 1, wherein quantifying the distortion or the deviation comprises analyzing a magnification or orthogonality error in the imprint lithographic template or the substrate.

3. The method of claim 1, wherein the first area corresponds to a first protrusion of the imprint lithographic template, and the second area corresponds to a second protrusion of the imprint lithographic template spaced apart from the first protrusion.

4. The method of claim 1, wherein the first and second areas correspond to different, spaced-apart areas of a same protrusion.

5. The method of claim 1, further comprising determining a dispense pattern for the formable material based at least in part on the deviation, wherein dispensing the formable material is performed using the dispense pattern.

6. The method of claim 5, wherein a third area corresponds to at least one recession within the imprint lithographic template.

7. The method of claim 6, wherein determining the dispense pattern is performed such that the formable material is dispensed to a third areal density within the third area, wherein the third areal density is greater than each of the first and second areal densities.

8. The method of claim 7, wherein determining the dispense pattern is based in part on the deviation in planarity along the primary surface of the imprint lithographic template, the substrate within the imprint region, or both within the third area.

9. The method of claim 1, further comprising exposing the formable material to ultraviolet radiation to polymerize the formable material and form a polymer layer, wherein the polymer layer has a first thickness within the first area and a second thickness within the second area, and the first thickness is greater than the second thickness.

10. The method of claim 9, wherein the first thickness is at least 5%, at least 11%, or at least 20% thicker than the second thickness, and is at most 200%, at most 150%, or at most 95% thicker than the second thickness.

11. The method of claim 9, further comprising separating the template from the polymer layer.

12. The method of claim 11, further comprising:
forming an etch-resistant layer within a recession in the polymer layer;
removing a portion of the etch-resistant layer that overlies a protrusion in the polymer layer; and
removing the protrusion in the polymer layer.

13. A method forming an article comprising:
providing an imprint apparatus comprising:
a substrate holder including a chucking region having a substrate support surface for a substrate;
a template holder for an imprint lithographic template having an imprint surface that includes at least one protrusion; and
a processor configured to dispense an amount of a formable material in a particular area based at least in part on a distortion in the substrate, the lithographic template, the substrate holder, or any combination thereof;
placing a substrate of the article over the chucking region, wherein the substrate has a primary surface within an imprint region;
quantifying a distortion in the substrate, a deviation in planarity along the primary surface of lithographic template, a deviation in planarity along a surface of a component within the imprint apparatus, or any combination thereof, wherein quantifying the distortion comprises determining a deviation in planarity along the primary surface of the substrate support surface of the chucking region within the imprint region, the primary surface of the substrate within the imprint region, or any combination thereof; and
dispensing a formable material over the primary surface of the substrate based at least in part on the distortion in the substrate, the deviation in planarity along the primary surface of the lithographic template, a deviation in planarity along the surface of the component within the imprint apparatus, or any combination thereof, wherein dispensing the formable material is performed such that the formable material is dispensed to:
a first areal density within a first area, where the deviation indicates that the at least one protrusion and the primary surface will be further apart when the imprint lithographic template contacts the formable material within the first area; and
a second areal density within a second area, where the deviation indicates that the at least one protrusion and the primary surface will be closer to each other when the imprint lithographic template contacts the formable material within the second area, wherein the first areal density is greater than the second areal density.

14. A method comprising:
providing an imprint lithographic template having an imprint surface that includes at least one protrusion, wherein the at least one protrusion defines a primary surface;
providing a substrate holder including a chucking region having a substrate support surface;
placing a substrate over the chucking region, wherein the substrate has a primary surface within an imprint region;
quantifying a distortion in the substrate, the lithographic template, the imprint apparatus, or any combination thereof; and
dispensing a formable material over the primary surface of the substrate based at least in part on the distortion, wherein dispensing the formable material is performed such that the formable material is dispensed to:
a first areal density within a first area, where the distortion indicates that the at least one protrusion and the primary surface will be further apart when the imprint lithographic template contacts the formable material within the first area; and
a second areal density within a second area, where the distortion indicates that the at least one protrusion and the primary surface will be closer to each other when the imprint lithographic template contacts the formable material within the second area, wherein the first areal density is greater than the second areal density.

15. The method of claim 14, further comprising determining a dispense pattern for the formable material based at least in part on the distortion, wherein dispensing the formable material is performed using the dispense pattern.

16. The method of claim 15, wherein:
a third area corresponds to at least one recession within the imprint lithographic template;
determining the dispense pattern is based in part on a deviation in planarity along the primary surface of the imprint lithographic template, the substrate within the imprint region, or both within the third area; and determining the dispense pattern is performed such that the formable material is dispensed to a third areal density within the third area, wherein the third areal density is greater than each of the first and second areal densities.

17. The method of claim 14, further comprising exposing the formable material to ultraviolet radiation to polymerize the formable material and form a polymer layer, wherein the polymer layer has a first thickness within the first area and a second thickness within the second area, and the first thickness is greater than the second thickness.

18. The method of claim 17, wherein the first thickness is at least 5%, at least 11%, or at least 20% thicker than the second thickness, and is at most 200%, at most 150%, or at most 95% thicker than the second thickness.

* * * * *

UNITED STATES PATENT AND TRADEMARK OFFICE
CERTIFICATE OF CORRECTION

PATENT NO. : 9,993,962 B2
APPLICATION NO. : 15/162130
DATED : June 12, 2018
INVENTOR(S) : Anshuman Cherala It is certified that error appears in the above-identified patent and that said Letters Patent is hereby corrected as shown below:

In the Claims

Column 15, Line 64, in Claim 13, please replace "surface of lithographic" with --surface of the lithographic--.

Signed and Sealed this
Twenty-eighth Day of August, 2018

Andrei Iancu
*Director of the United States Patent and Trademark Office*